(12) United States Patent
McCullough

(10) Patent No.: US 6,367,541 B2
(45) Date of Patent: Apr. 9, 2002

(54) CONFORMING HEAT SINK ASSEMBLY

(75) Inventor: Kevin A. McCullough, N. Kingstown, RI (US)

(73) Assignee: Cool Options, Inc., Warwick, RI (US)

( * ) Notice: Subject to any disclaimer, the term of this patent is extended or adjusted under 35 U.S.C. 154(b) by 0 days.

(21) Appl. No.: 09/850,017

(22) Filed: May 7, 2001

Related U.S. Application Data

(63) Continuation-in-part of application No. 09/306,098, filed on May 6, 1999, now abandoned.

(51) Int. Cl.[7] ............................................. H05K 7/20
(52) U.S. Cl. .................. 165/80.3; 165/185; 29/890.03; 361/704
(58) Field of Search .................. 165/185, 80.3; 29/890.03; 174/16.3; 361/704, 697, 710; 257/722

(56) References Cited

U.S. PATENT DOCUMENTS

| | | | | |
|---|---|---|---|---|
| 2,711,382 A | * | 6/1955 | Smith-Johannsen | 156/227 |
| 4,964,458 A | * | 10/1990 | Flint et al. | 165/46 |
| 5,168,348 A | * | 12/1992 | Chu et al. | 257/713 |
| 5,653,280 A | * | 8/1997 | Porter | 165/185 |
| 5,771,966 A | * | 6/1998 | Jacoby | 165/185 |
| 5,829,512 A | * | 11/1998 | August | 165/185 |
| 5,837,081 A | * | 11/1998 | Ting et al. | 156/89.26 |
| 5,894,882 A | * | 4/1999 | Kikuchi et al. | 165/185 |
| 5,912,805 A | * | 6/1999 | Freuler et al. | 156/346 |

* cited by examiner

*Primary Examiner*—Allen Flanigan
(74) *Attorney, Agent, or Firm*—Barlow, Josephs & Holmes, Ltd.

(57) ABSTRACT

A conforming heat sink assembly for removing heat from heat generating components, having respective top surfaces defining different heights is provided with a flexible thermally conductive base member with a top surface and a bottom surface. The bottom surface is adapted to be positioned in flush thermal communication with the top surfaces of each of the components. The bottom portions of a heat dissipating element are embedded in a flexible thermally conductive base member. The heat dissipating member is corrugated to define a number of lower contact points and upstanding fin members. The lower contact points are movable relative to one another in accordance with the top surface of the flexible thermally conductive base member. The heat dissipating element is affixed to the flexible thermally conductive base member at its lower contact points to form a conforming heat sink assembly.

9 Claims, 4 Drawing Sheets

CONFORMING HEAT SINK ASSEMBLY

This application is a continuation-in-part of U.S. Ser. No. 09/306,098, filed May, 6, 1999 now abandoned.

BACKGROUND OF THE INVENTION

The present invention relates generally to electronic solid state and integrated circuit devices. More specifically, the present invention relates to apparatuses for dissipating heat generated by such devices. In addition, the present invention relates to cooling of multiple heat generating electronic devices with a single heat sink assembly.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers.

Also, it is very common in the electronics industry to many electronic devices on a single circuit board, such as a motherboard, modem, or "processor card" such as the Celeron board manufactured by Intel Corporation. Many times, a number of these electronic devices suffer from over heating in similar fashion to the devices discussed above. If such heat is not properly dissipated from these devices, the device or component will eventually fail or cease to operate properly. For example, a number of electronic devices may be installed proximal to one another in a cluster on a particular region on a circuit board. If each of these devices require cooling to avoid failure, some type of heat dissipation is necessary.

In the prior art, it has been common to provide "bulk" cooling to a group of devices that require heat dissipation. In these devices, a single heat sink is placed over all of the devices that required cooling. For example, a block heat sink with a base with a flat bottom and upstanding pins, is dimensioned large enough to rest on the top heat generating surfaces of each of the heat generating devices. In this prior art assembly, the base of the heat sink member is affixed to the top surfaces of the devices to be cooled by a thermally conductive epoxy, thermally conductive double-side tape, and the like. As a result, a single heat sink member may simultaneously provide heat dissipating for a number of devices.

The foregoing prior art assembly is generally acceptable when all of the devices to be cooled have the same thickness or if their top surfaces lie in the same plane. This is required so that the block heat sink base may sit flush on the top surfaces for proper thermal transfer. Modifications to this general prior art assembly have been made for the block heat sink to specifically accommodate multiple devices that are of different heights or have top surfaces that do not lie in the same plane. In particular, highly compressible thermally conductive gap pads or gap filler materials are commonly used to fill the gaps between the bottom of the heat sink and the top surfaces of the devices to be cooled. For example, if a device is shorter than other devices in the group of devices to be cooled, the gap pad expands so as to fill the void between to bottom of the heat sink and the top of the device to bridge the thermal gap for that shorter device. This enables thermal transfer to the shorter device. Gap pads of the prior art are simply affixed to the heat sink and top surfaces by thermally conductive epoxy, or the like, and/or the entire assembly may be secured together by mechanical structures, such as clamps or fasteners.

The foregoing heat sink assemblies of the prior art suffer from the disadvantages employing a large rigid heat sink member. The use of gap pads or gap fillers suffer from poor thermal transfer uniformity, particularly where the group of devices to be cooled have a great degree of variance of height. Gap pads suffer from varying degrees of thermal conductivity because the thermal conductivity through the thickness of gap pad is proportional to the amount of compression of the pad. For example, the more the gap pad is compressed, the better the thermal conductivity will be. Therefore, the taller devices within a group will have greater thermal transfer to the heat sink than the shorter devices which have a less compressed gap pad between it and the heat sink member. As a result, use of a gap pad will necessarily result in non-uniform thermal transfer causing overall inferior thermal conductivity.

In view of the foregoing, there is a demand for a heat sink assembly that is capable of dissipating heat from a group of devices simultaneously. There is a demand for a heat sink assembly that can provide uniform heat dissipation for the entire group of devices to be cooled. In addition, there is a demand for a complete heat sink assembly to be able to accommodate group of devices without the use of a gap pad.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling heat generating electronic components installed on a circuit board. The heat sink assembly of the present invention enables the simple, easy and inexpensive assembly, use and maintenance of a heat sink assembly while realizing superior heat dissipation. The heat sink of the present invention has particular application in simultaneously providing heat dissipation for a number of electronic components that may be of different sizes, shapes, configurations and heights or thicknesses.

The conforming heat sink assembly for removing heat from electronic components, having respective top surfaces defining different heights and installed on a circuit board, of the present invention is provided with a flexible thermally conductive base member with a top surface and a bottom surface. The bottom surface is adapted to be positioned in flush thermal communication with the top surfaces of each of the electronic components installed on a circuit board. A heat dissipating element is affixed to the upper surface of the flexible thermally conductive base member. The heat dissipating member is corrugated to define a number of lower contact points and upstanding fin members. The lower contact points are movable relative to one another in accordance with the top surface of the flexible thermally conductive base member. The heat dissipating element is affixed to the flexible thermally conductive base member at its lower contact points to form a conforming heat sink assembly.

For assembly and installation, the corrugated heat dissipating member is bonded to the flexible thermally conductive base member with a thermally conductive epoxy. Preferably, thermally conductive double-sided tape is adhered to each of the top surfaces of electronic components to be cooled. The base of the heat sink assembly of the present invention is then mated with the top surfaces of the components to be cooled where the base member is flexed and manipulated as needed to fully engage with the top surfaces of the components, As a result, various regions of the bottom surface of the base member may lie in different planes than one another to accommodate component top surfaces which may not lie in the same plane. When the base member is flexed and manipulated to accommodate the component top surfaces, the corrugated heat dissipating member simultaneously adjusts and flexes despite structural bonding thereto with epoxy.

It is therefore an object of the present invention to provide a heat sink assembly that can provide heat dissipation for more than one heat generating electronic component at a time.

It is an object of the present invention to provide a single heat sink assembly that can provide simultaneous heat dissipation for heat generating electronic components that have different heights or thicknesses.

It is a further object of the present invention to provide a heat sink assembly that can easily adapt to a non-uniform heat generating surface for heat dissipation therefrom.

Another object of the present invention is to provide a heat sink assembly that is lightweight.

It is a further object of the present invention to provide a heat sink assembly can be installed without additional tools.

It is yet a further object of the present invention to provide a heat sink that has an ultra light fin configuration.

Another object of present invention is to provide a heat sink assembly that is highly resistant to vibration and shock.

A further object of the present invention is to provide a heat sink assembly that has a lower center of mass and less joint stress.

Another object of the present invention is provide a heat sink assembly that has lower junction resistance and a lower overall system resistance.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

Figure 1:
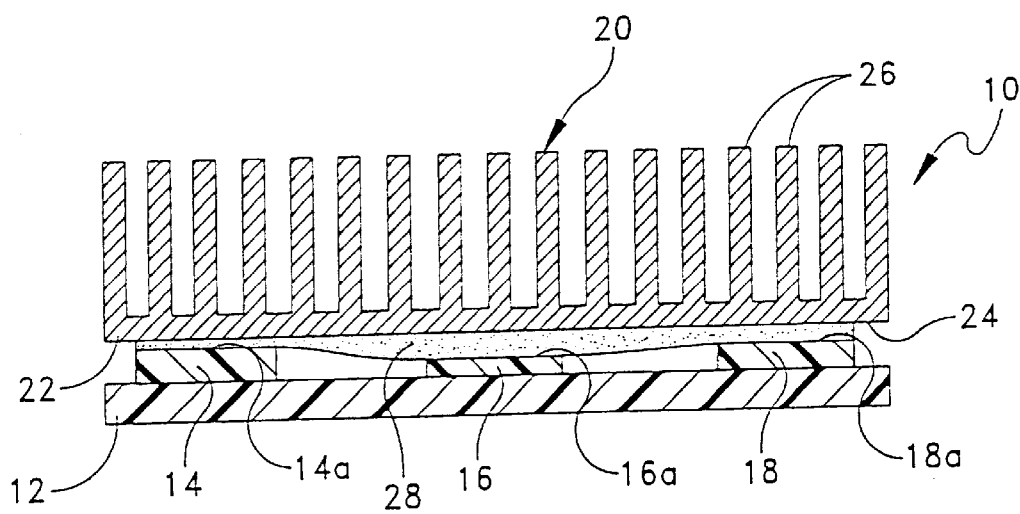
FIG. 1 is a cross-sectional view of a prior art heat sink assembly for a group of devices to be cooled.

Turning first to FIG. 1, a prior art heat sink assembly 10 is shown to include a circuit board 12 and a number of devices 14, 16 and 18, to be cooled, which are installed thereon. For illustration purposes, which is common in the industry, a sample three component structure of devices 12, 16 and 18 are shown which are of three different heights while being simultaneously cooled by a single heat sink member 20 with a base 22 with a flat bottom 24 and upstanding fins 26 attached thereto. In particular, the top surfaces 14a, 16a and 18a of the devices 14, 16 and 18 do not lie in the same plane thus they require some type of gap filling structure. As shown, a gap pad 28 is provided in the prior art assembly of FIG. 1 whereby varying degrees of compression are employed to sufficiently bridge the three thermal gaps between each of the devices 14, 16 and 18 to be cooled and the bottom surface 24 of the heat sink member 20.

Since the leftmost device 14 is the tallest, the most compression is required of the gap pad 28 while the middle device 16 is the shortest requiring the least amount of compression to bridge the gap. The rightmost device 18 is of middle height and the gap pad portion therebetween has a compression between the tallest device 14 and the shortest device 16. As a result, as discussed above, the tallest device 14 will achieve the best thermal transfer to the heat sink member 26 while the shortest device 16 will achieve the worst thermal transfer performance of the three.

The prior art device 10 shown in FIG. 1 is very heavy as it employs a block heat sink 20 extruded from aluminum stock. The interconnection between the heat sink member and the devices 14, 16 and 18 to be cooled is not structurally strong thus risks separation during shipment and the like. The additional weight is unacceptable, particularly in laptop computers, where overall weight of the computer is of paramount concern. Further, the heavy weight of the heat sink member 20 make it top heavy thus placing stress on the gap pad joint, particularly where the prior art heat sink assembly 10 is vertically oriented, such as in a tower computer where the motherboard is vertically positioned.

Figure 2:
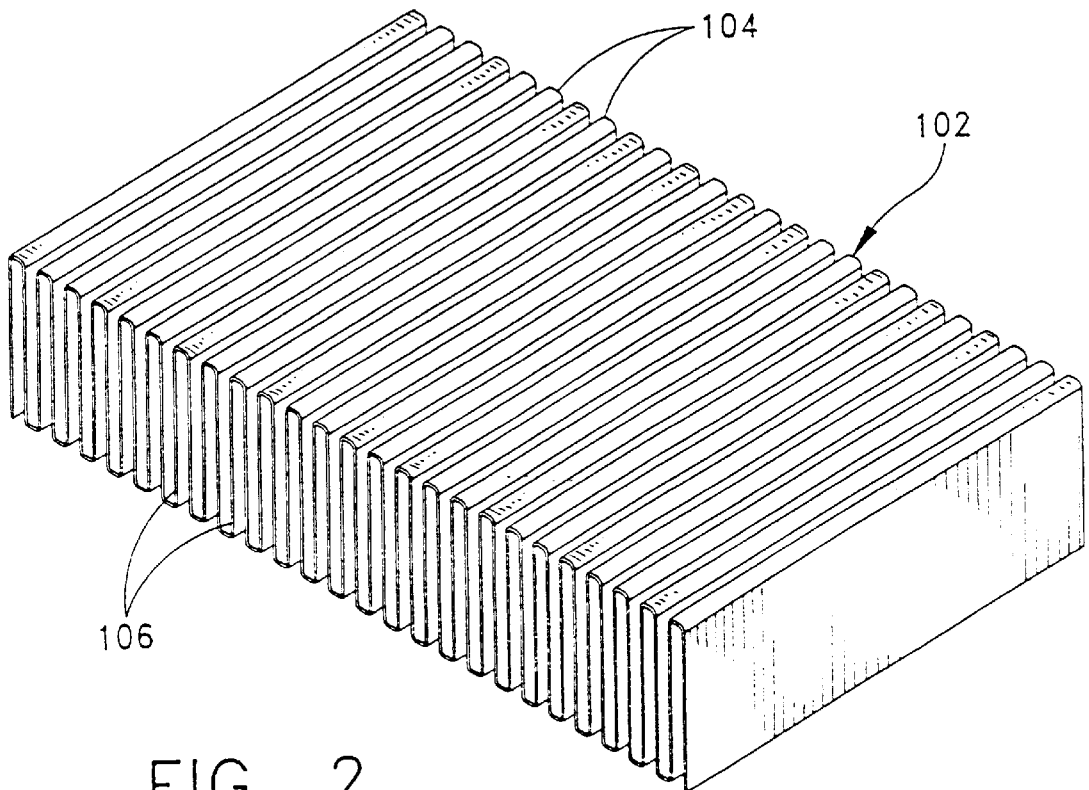
FIG. 2 is a perspective view of the heat sink member employed in the heat sink assembly of the present invention.
Figure 3:
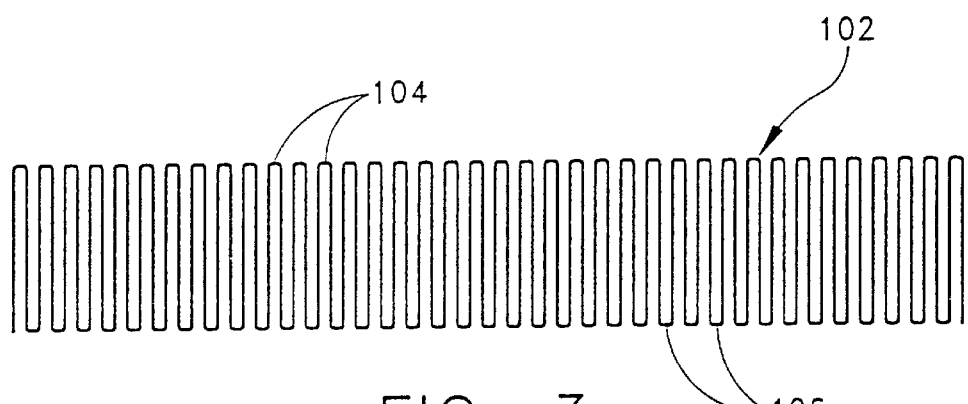
FIG. 3 is a front view of the heat sink member of FIG. 2.

Turning now to FIG. 2-6, the heat sink assembly 100 of the present invention is shown in detail. The disadvantages suffered by the prior art device shown in FIG. 1 are solved by the present invention. Referring first to FIGS. 2 and 3, the heat dissipating member 102 is preferably a corrugated member with an undulating structure creating a number of peaks 104 and valleys 106 where the bottoms of the valleys provide to contact points for installation to a base member as will be described in detail below. This heat dissipating member 102 is preferably crimped or formed from a single sheet of thermally conductive material, such as aluminum of an approximate thickness of 20 mils. This member 102 provides for a series of upstanding fin-like member to facilitate heat dissipation when in contact with ambient air.

This heat dissipation member 102 employed in the assembly 100 of the present invention is preferred in that it is very lightweight and easy and inexpensive to manufacture. It should be understood that the undulating construction shown in FIGS. 2 and 3 is one of many different types of crimped or formed heat dissipating members 102 that are within the scope of the present invention. For example, instead of the square wave configuration shown in FIGS. 2 and 3, a triangular or sinusoidal wave (not shown) maybe employed depending on the application at hand. Further, many different types of materials may be employed in addition to aluminum, such as copper.

Figure 4:
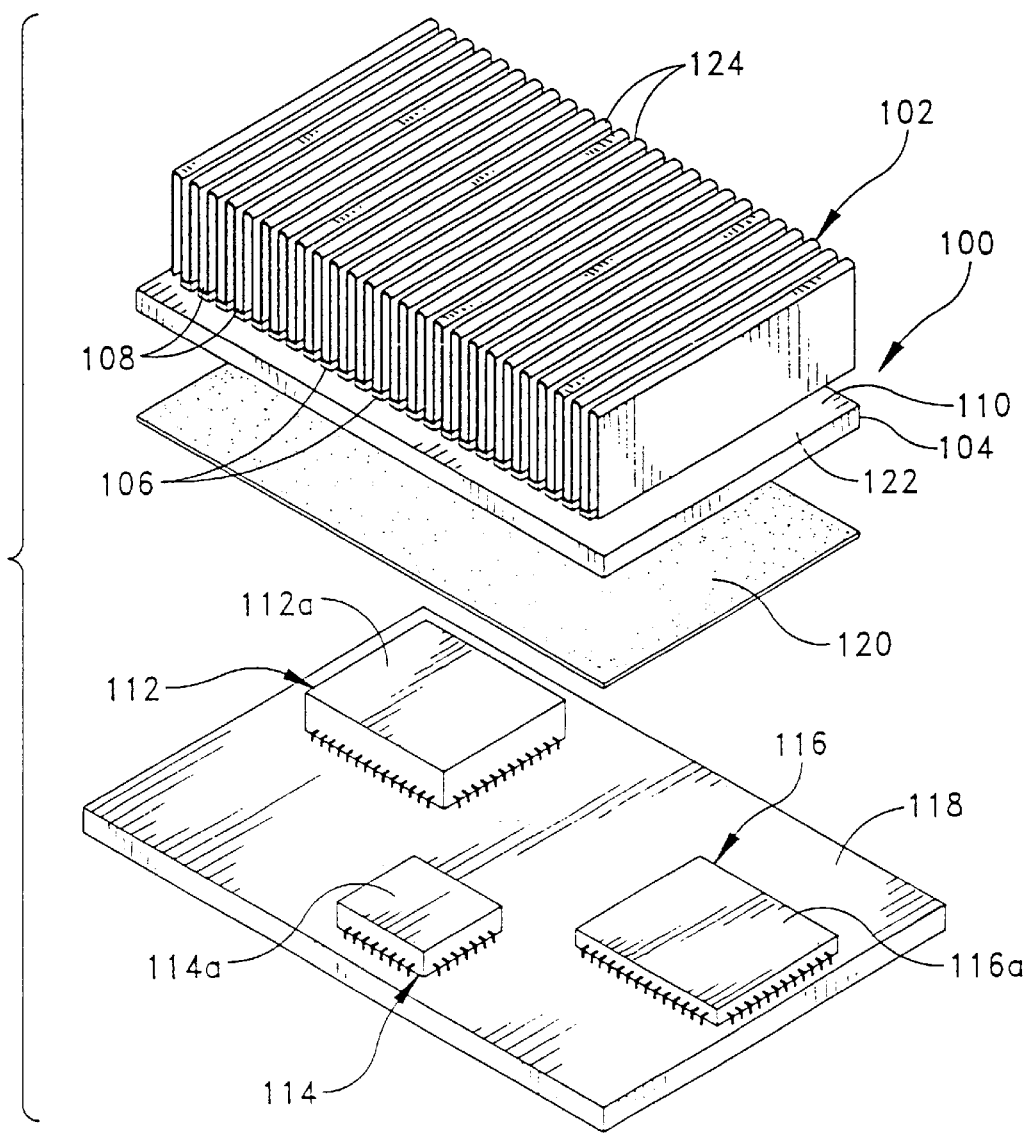
FIG. 4 is an exploded perspective view of the heat sink assembly of the present invention installed on a circuit board with a group of devices installed thereon.
Figure 5:
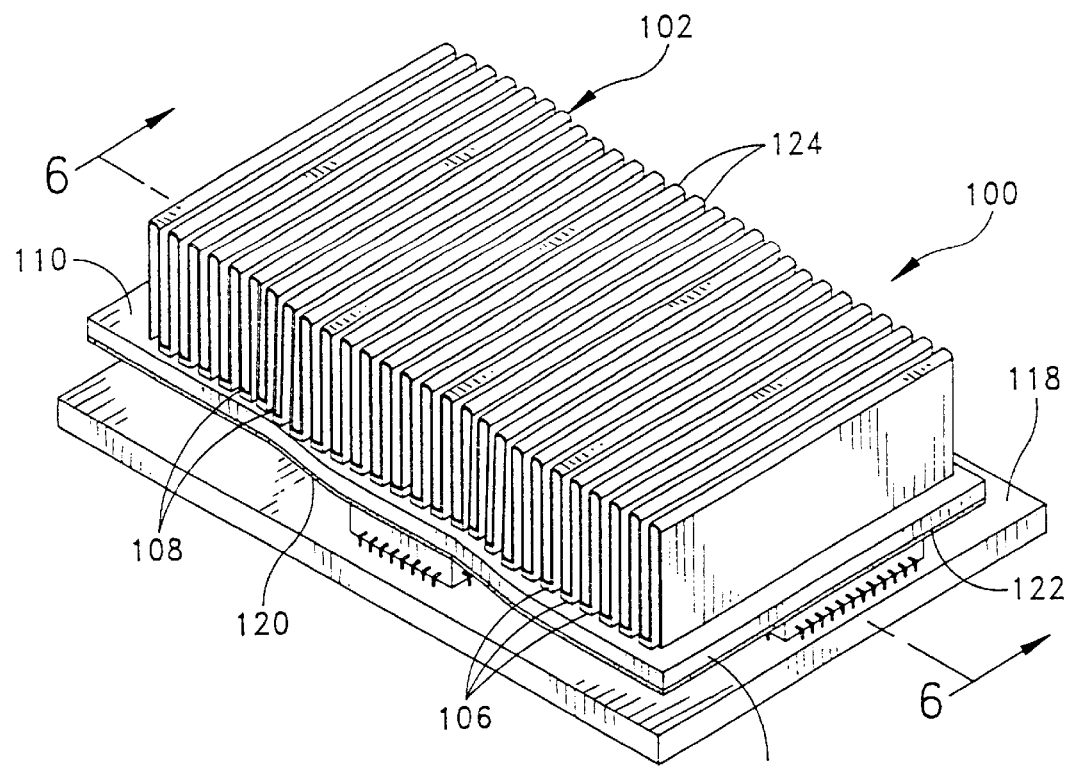
FIG. 5 is a perspective view of the heat sink assembly of the present invention installed on a circuit board with a group of devices installed thereon.
Figure 6:
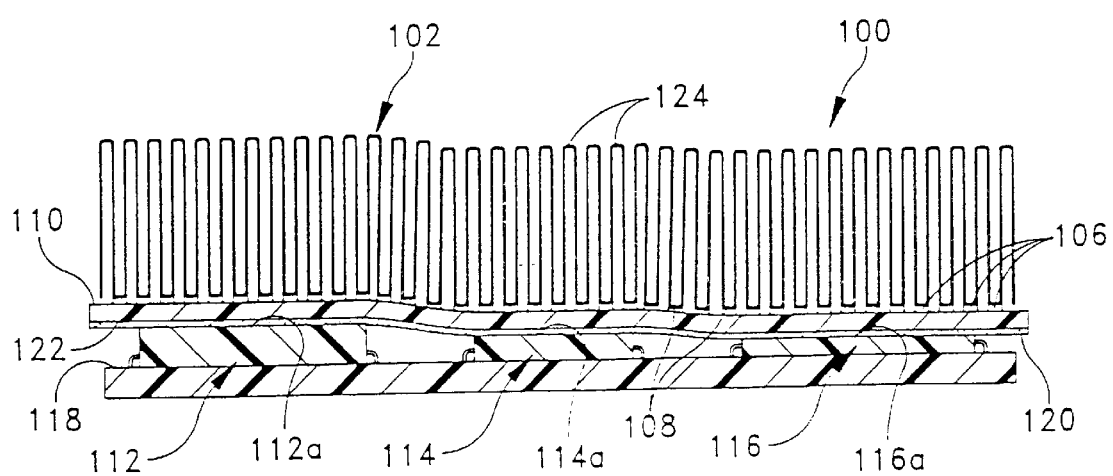
FIG. 6 is a cross-sectional view through the line 6-6 of FIG. 5

The overall construction and installation of the assembly 100 of present invention on a circuit board is shown in FIGS. 4–6. Referring to FIG. 4, a perspective view of the construction of the conforming heat sink assembly 100 of the present invention is shown. The heat dissipating member 102 is bonded to a flexible base member 104 by thermally conductive epoxy 106 or the like. More specifically, the lower contact points 108 at the valleys of the heat dissipating member 102 are bonded to the top surface 110 of the flexible base member 104. The flexible base member 104 is, preferably, a sheet of thermally conductive material with an optimal thickness of approximately 100 mils. Preferably, the conductive material for the flexible sheet is carbon-carbon matrix material for extremely high thermal conductivity. However, other flexible materials, such as conductive polymer composites, may be employed for the base member 104 depending on the application.

As shown in the exploded perspective view of FIG. 4, the heat sink assembly 100 is preferably dimensioned to be large enough to cover the electronic components 112, 114 and 116 to be cooled on a given circuit board 118. In particular, the flexible base 104 may be dimensioned to span underneath and contact all of the lower contacts points or valleys 108 of the heat dissipating member 102. Such a large area heat sink assembly 100 is easy to manufacture and requires little customization. Alternatively, the flexible base member 104 may be cut into a specific footprint to match the pattern of heat generating devices 112, 114 and 116 to be cooled to avoid excess material of the base member 104. Further, the heat dissipating member 102 itself may be sized and cut into a specific footprint to match the layout of the devices 112, 114 and 116 to be cooled.

FIGS. 5 and 6 illustrate actual installation of the heat sink assembly 100 of the present invention onto a number of devices 112, 114 and 116 on a substrate 118, such as a circuit board. FIG. 5 shows a perspective view of the assembly 100 while FIG. 6 shows a cross-sectional view through the line 6—6 of FIG. 5. FIGS. 5 and 6 illustrate the preferred embodiment where the base member 104 and heat dissipating member 102 are not, for simplicity, cut to a specific footprint to the layout of the components 112, 114 and 116 to be cooled. The flexible base 104 and heat dissipating member 102 bonded thereon are long and wide enough to cover all of the three devices 112, 114 and 116 shown on the circuit board 118. As can be understood, a layout of three devices 112, 114 and 116 are for illustration purposes only and any number of heat generating devices may be accommodated by the present invention.

First, the heat dissipating member 102 is bonded to the top surface 110 of the flexible base member 104 to provide the conforming heat sink assembly 100 of the present invention. Next, the assembly 100 is installed on the devices 112, 114 and 116 to be cooled. A layer of bonding material 120, such as pressure sensitive double-sided tape, is applied to the bottom 122 of the flexible base member 104 for bonding of the conforming heat sink assembly 100 to the top surfaces 112a, 114a and 116a of the devices 112, 114 and 116 to be cooled. The conforming assembly 100 is placed over the devices 112, 114 and 116 to be cooled and then pressed down into communication with the top surfaces 112a, 114a and 116a of the devices 112,114 and 116 so that the bonding material 120 is engaged.

Most importantly, the top portions or peaks 124 of the heat dissipating member 102 are pressed downwardly so as to urge the bottom 122 of the flexible base member 104 into contact with each of the top surfaces 112a, 114a and 116a of the devices 112, 114 and 116 to be cooled, even when the devices 112, 114 and 116 have different heights, as shown in FIGS. 4–6. As particularly seen in FIG. 6, the flexible base member 104 conforms and adapts to the top surfaces 112a, 114a and 116a of the devices 112, 114 and 116 to be cooled. Also, the heat dissipating member 102 of the present invention, due to its undulating corrugated configuration, conforms to the flexible base member 104 thus providing uniform thermal transfer and dissipation from the devices 112, 114 and 116 to be cooled.

Figure 7:
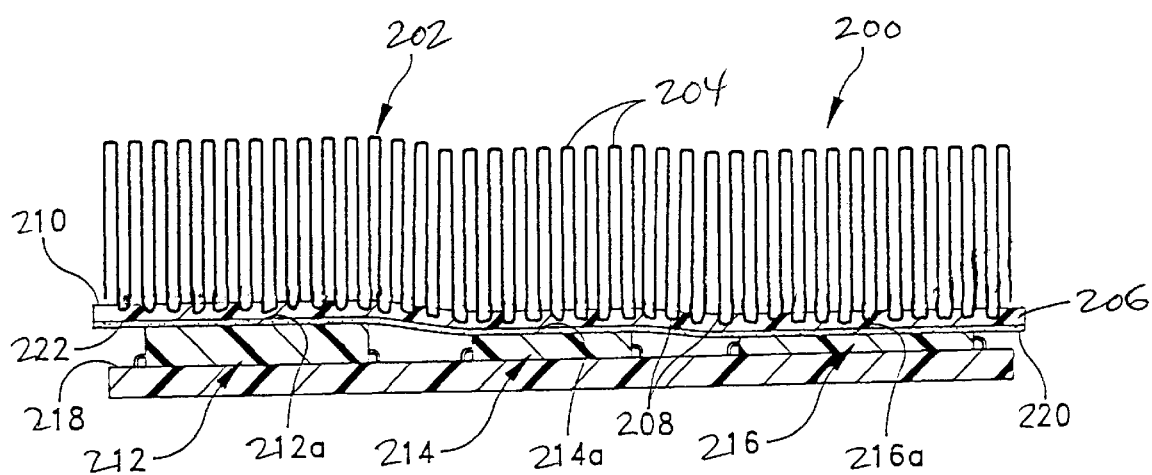
FIG. 7 is an alternative embodiment of the heat sink assembly shown in FIG. 4.

As shown in FIG. 7, an alternative embodiment 200 of the heat sink assembly of the present invention is shown in detail. In similar fashion to the preferred embodiment 100 of the present invention, the disadvantages suffered by the prior art device shown in FIG. 1 can also be solved by the alternative embodiment 200 of the present invention. In FIG. 7, the heat dissipating member 202 is preferably a corrugated member with an undulating structure creating a number of peaks 204 and valleys 208 where the bottoms of the valleys provide to contact points for installation into a base member as will be described in detail below. This heat dissipating member 202 is preferably crimped or formed from a single sheet of thermally conductive material, such as aluminum of an approximate thickness of 20 mils. This member 202 provides for a series of upstanding fin-like member to facilitate heat dissipation when in contact with ambient air. This heat dissipation member 202 employed in the assembly 200 of the present invention is preferred in that it is very lightweight and easy and inexpensive to manufacture. It should be understood that the undulating construction of heat dissipating member 202 is one of many different types of crimped or formed heat dissipating members that are within the scope of the present invention. For example, instead of the square wave configuration shown in FIG. 7, a triangular or sinusoidal wave (not shown) maybe employed depending on the application at hand. Further, many different types of materials may be employed in addition to aluminum, such as copper.

The overall construction and installation of the assembly 200 of the alternative embodiment of the of present invention on a circuit board is shown in FIG. 7. The heat dissipating member 202 is embedded directly into flexible base member 206 by insert molding the valleys 208 of heat dissipating member 202 directly into flexible base 206. More specifically, the lower contact points 208 at the valleys of the heat dissipating member 202 are physically secured into flexible base member 204. By such an insert molding connection, the lower contact points 208 are secured in thermally transfer communication with the flexible base 206. The flexible base member 206 is, preferably, a sheet of thermally conductive material with an optimal thickness of approximately 100 mils. Preferably, the conductive material for the flexible sheet is carbon-carbon matrix material for extremely high thermal conductivity and which can be molded, such as by injection molding. However, other flexible materials, such as conductive polymer composites, may be employed for the base member 206 depending on the application.

Still referring to FIG. 7, the heat sink assembly 200 is preferably dimensioned to be large enough to cover the electronic components 212, 214 and 216 to be cooled on a given circuit board 218. In particular, the flexible base 206 may be dimensioned to span underneath and contact all of the lower contacts points or valleys 208 of the heat dissipating member 202. Such a large area heat sink assembly 200 is easy to manufacture and requires little customization. Alternatively, the flexible base member 206 may be cut into a specific footprint to match the pattern of heat generating devices 212, 214 and 216 to be cooled to avoid excess material of the base member 206. Further, the heat dissipating member 202 itself may be sized and cut into a specific footprint to match the layout of the devices 212, 214 and 216 to be cooled.

The heat sink assembly of FIG. 7 is affixed to a circuit board in similar fashion to the heat sink assembly of FIGS. 4–6. First, the heat dissipating member 202 is bonded to the top surface 210 of the flexible base member 206 to provide the conforming heat sink assembly 200 of the present invention. Next, the assembly 200 is installed on the devices 212, 214 and 216 to be cooled. A layer of bonding material 220, such as pressure sensitive double-sided tape, is applied to the bottom 222 of the flexible base member 206 for bonding of the conforming heat sink assembly 200 to the top surfaces 212a, 214a and 216a of the devices 212, 214 and 216 to be cooled. The conforming assembly 100 is placed over the devices 212, 214 and 216 to be cooled and then pressed down into communication with the top surfaces 212a, 214a and 216a of the devices 212, 214 and 216 so that the bonding material 220 is engaged.

Most importantly, the top portions or peaks 204 of the heat dissipating member 202 are pressed downwardly so as to urge the bottom 222 of the flexible base member 206 into contact with each of the top surfaces 212a, 214a and 216a of the devices 212, 214 and 216 to be cooled, even when the devices 212, 214 and 216 have different heights, as shown in FIGS. 4–6. The flexible base member 206 conforms and adapts to the top surfaces 212a, 214a and 216a of the devices 212, 214 and 216 to be cooled. Also, the heat dissipating member 202 of the present invention, due to its undulating corrugated configuration, conforms to the flexible base member 206 thus providing uniform thermal transfer and dissipation from the devices 212, 214 and 216 to be cooled.

The alternative embodiment 200 of FIG. 7 provides all of the advantages that the preferred embodiment 100 has over the prior art. In addition, the alternative embodiment 200 of FIG. 7 provides a superior heat sink assembly 200 because of the unique connection of the heat dissipating member 202 and the flexible base 206. In particular, as stated above, the bottom portions or valleys 208 of the heat dissipating member 202 are physically embedded or encapsulated within the body of the flexible base member 206. This is accomplished during the molding or forming process of the base member 206. Such an interconnection greatly reduces if not completely eliminates the junction resistance between the valleys 208 and the body of the flexible base 206. More specifically, the contact resistance, conductive resistance and surface to air resistance are greatly reduced when the valleys 208 are embedded into flexible base 206 resulting in an overall system resistance that is less than prior art heat sink assemblies.

Therefore, the embedding of the fin structure, namely valleys 208, within the flexible base 206, as opposed to affixing the valleys 208 to the top surface 210 of the flexible base 206, provides a superior heat sink assembly 200 in that overall thermal conductivity and thermal efficiency is greatly improved.

As a result, bulk cooling of multiple devices can be achieved without the use of gap pads or fillers which reduce the thermal conductivity of the assembly and create non-uniformity in heat dissipation from device to device. The present invention provides for a heat sink assembly that can provide uniform thermal transfer regardless of the height of the devices to be cooled in a construction that is easy and inexpensive to manufacture.

The present invention has a wide range of applications and can be easily adapted for such applications. For example, the present invention may be employed for any heat generating surface that is non-uniform. Further applications include any circuit board configuration where a heat generating device is provided on a circuit board. The present invention may be easily adapted to an application where the circuit board containing the heat generating device is encased in a housing, such as a Pentium II configuration. In this arrangement (not shown), the preferred embodiment may be easily modified to accommodate such a package.

It would be appreciated by those skilled in the art that various changes and modifications can be made to the illustrated embodiments without departing from the spirit of the present invention. All such modifications and changes are intended to be covered by the appended claims.

What is claimed is:

1. A conforming heat sink assembly for removing heat from electronic components, having respective top surfaces defining different heights, installed on a circuit board, comprising:

a flexible thermally conductive base member having a top surface and a bottom surface; said bottom surface being adapted to be positioned in flush thermal communication with the top surfaces of each of said electronic components installed on a circuit board; said bottom surface of said thermally conductive base member defining a plurality of regions therein; said plurality of regions being capable of residing in different planes than one another with each of said plurality of regions residing in planes that are substantially parallel to said top surfaces of said electronic components;

a heat dissipating element embedded in said upper surface of said flexible thermally conductive base member; said heat dissipating member being corrugated and defining a plurality of lower contact points and upstanding fin members; said heat dissipating member having an undulating cross-section with a plurality of valleys defining said lower contact points and a plurality of peaks defining said upstanding fin members; said lower contact points being movable relative to one another in accordance with said top surface of said flexible thermally conductive base member and in a direction substantially perpendicular to said top surfaces of said electronic components and said lower contact points of said heat dissipating member being capable of lying in different planes than one another and conforming to said top surface of said thermally conductive base member; said lower contact points of said heat dissipating element being embedded in said flexible thermally conductive base member.

2. The conforming heat sink assembly of claim 1, wherein said heat dissipating element is inserted molded into said thermally conductive base member.

3. The conforming heat sink assembly of claim 1, wherein said thermally conductive base member is made of carbon-carbon matrix material.

4. The conforming heat sink assembly of claim 1, wherein said heat dissipating member is made of aluminum.

5. A conforming heat sink assembly for removing heat from electronic components, having respective top surfaces defining different heights, installed on a circuit board, comprising:

a flexible thermally conductive base member having a top surface and a bottom surface and being manufactured of a carbon-carbon matrix material; said bottom surface being adapted to be positioned in flush thermal communication with the top surfaces of each of said electronic components installed on a circuit board; said bottom surface of said thermally conductive base member defining a plurality of regions therein; said plurality of regions being capable of residing in different planes than one another with each of said plurality of regions residing in planes that are substantially parallel to said top surfaces of said electronic components;

a heat dissipating element embedded in said upper surface of said flexible thermally conductive base member; said heat dissipating member being corrugated and defining a plurality of lower contact points and upstanding fin members; said heat dissipating member having an undulating cross-section with a plurality of valleys defining said lower contact points and a plurality of peaks defining said upstanding fin members; said lower contact points being movable relative to one another in accordance with said top surface of said flexible thermally conductive base member and in a direction substantially perpendicular to said top surfaces of said electronic components and said lower contact points of said heat dissipating member being capable of lying in different planes than one another and conforming to said top surface of said thermally conductive base member; said lower contact points of said heat dissipating element being embedded in said flexible thermally conductive base member.

6. The conforming heat sink assembly of claim 5, wherein said heat dissipating element is inserted molded into said thermally conductive base member.

7. The conforming heat sink assembly of claim 5, wherein said heat dissipating member is made of aluminum.

8. The method of manufacturing a heat sink assembly, comprising the steps of:

providing a flexible thermally conductive base member having a top surface and a bottom surface; said bottom surface being adapted to be positioned in flush thermal communication with the top surfaces of electronic components installed on a circuit board; said bottom surface of said thermally conductive base member defining a plurality of regions therein; said plurality of regions being capable of residing in different planes than one another with each of said plurality of regions residing in planes that are substantially parallel to said top surfaces of said electronic components; and partially embedding a heat dissipating element in said upper surface of said flexible thermally conductive base member; said heat dissipating member being corrugated and defining a plurality of lower contact points and upstanding fin members; said heat dissipating member having an undulating cross-section with a plurality of valleys defining said lower contact points and a plurality of peaks defining said upstanding fin members; said lower contact points being movable relative to one another in accordance with said top surface of said flexible thermally conductive base member and in a direction substantially perpendicular to said top surfaces of said electronic components and said lower contact points of said heat dissipating member being capable of lying in different planes than one another and conforming to said top surface of said thermally conductive base member.

9. The method of claim 8, wherein said heat dissipating element is embedded into said thermally conductive base member by insert molding.

* * * * *